United States Patent
Kubo et al.

(10) Patent No.: US 6,764,547 B2
(45) Date of Patent: Jul. 20, 2004

(54) CRYSTAL GROWTH APPARATUS

(75) Inventors: Takayuki Kubo, Tokyo (JP); Fumio Kawahigashi, Tokyo (JP); Hiroshi Asano, Tokyo (JP); Naohiro Takaoka, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/149,223

(22) PCT Filed: Oct. 5, 2001

(86) PCT No.: PCT/JP01/08810
§ 371 (c)(1),
(2), (4) Date: Oct. 15, 2002

(87) PCT Pub. No.: WO02/31234
PCT Pub. Date: Apr. 18, 2002

(65) Prior Publication Data
US 2003/0051661 A1 Mar. 20, 2003

(30) Foreign Application Priority Data
Oct. 10, 2000 (JP) .......................................... 2000-309107

(51) Int. Cl.⁷ .............................................. C30B 35/00
(52) U.S. Cl. .................. 117/217; 117/208; 117/218; 117/222
(58) Field of Search .............................. 117/208, 217, 117/218, 222, 228

(56) References Cited

U.S. PATENT DOCUMENTS

| | | | |
|---|---|---|---|
| 6,117,402 A | * 9/2000 | Kotooka et al. | 422/245.1 |
| 6,482,263 B1 | * 11/2002 | Ferry et al. | 117/217 |
| 6,579,362 B2 | * 6/2003 | Ferry et al. | 117/208 |

* cited by examiner

Primary Examiner—Felisa Hiteshew
(74) Attorney, Agent, or Firm—Morrison & Foerster LLP

(57) ABSTRACT

An apparatus for growing a crystal, using the cooler 10 surrounding the single crystal 8 for high speed pulling. The cooler 10 is prepared using a copper-based metal and is water cooled. The supporting arm 12 that supports the cooler 10 is prepared using stainless steel or the like, which is higher in mechanical strength than copper-based metals and is inferior in thermal conductivity, and is detachably connected to the cooler 10. Excessive cooling of the supporting arm 12 and disposition due to precipitation of silicon oxide are prevented, leading to improvement in disposition free pulling rate without the prevention of speed-up. The cost of manufacture of the cooler 10 is saved. The support strength of the cooler is improved.

7 Claims, 3 Drawing Sheets

CRYSTAL GROWTH APPARATUS

TECHNICAL FIELD

The present invention relates to an apparatus for growing a crystal, used for manufacture of a silicon single crystal or the like used as a semiconductor material.

BACKGROUND ART

A variety of methods are available for manufacturing silicon single crystals, of which the Czochralski method (the CZ method) is typical. In producing a silicon single crystal by the CZ method, as is well known, a seed crystal is immersed in a silicon melt formed in a quartz crucible. The seed crystal is gradually pulled to allow a silicon single crystal to grow beneath the seed crystal while rotating the crucible and seed crystal.

In the pulling of silicon single crystal by such CZ method, it is known that the defect distribution or the like in a crystal section are governed by the rate of crystal growth, that is the pulling rate. More specifically explained, as the pulling rate is increased, a ring OSF generating area is moved towards the periphery and is finally excluded to the outside of the effective portion of the crystal. Conversely, a decrease in the pulling rate drifts a ring OSF generating area towards the central part of the crystal, and eventually the zone disappears in the central part.

While both the outside and inside of an OSF generating area are defect generating areas, their kinds of defects are different. In addition, it is known that a significant increase of the pulling rate, as a matter of course, improves productivity while refining the defects. Consequently, a speed-up in the pulling has been pursued as an approach to growing crystals.

Provision of a heat shield is known as a technique for high speed pulling. A heat shield is a cylindrical heat shielding member in a shape of inverted truncated cone that is disposed surrounding the single crystal. The shield is provided to speed up the withdrawal by shielding the radiation heat primarily from the melt in the crucible and heaters placed outside the crucible to facilitate cooling of the single crystal to be pulled from the melt.

Furthermore, attention is recently given to a technique where a coller that is forcedly cooled by water is placed inside the heat shield (Japanese Patent Laid-Open Nos. 63-256593, 8-239291, 11-92272 and 11-292684). Installation of a coller that is forcedly cooled by water inside the heat shield surrounding the single crystal facilitates cooling of the single crystal, particularly the high temperature portion thereof, leading to a further speedup of the pulling.

However, in an apparatus for growing a crystal that uses a cooler, proposed thus far, the cylindrical main body of the cooler thereof is supported and fixed inside the body of the crystal puller using part of the cooler itself, i.e. a flange integrated with the cylindrical main body or water piping projected from the cylindrical main body as a supporting member.

Use of a copper-based metal member forcedly cooled by passage of water is advisable as a cooler from the viewpoint of cooling ability for a single crystal. However, in a structure integrating a cylindrical main body with a supporting member thereof as discussed above, when the cylindrical main body is made of a copper-based metal, part of the supporting member also essentially needs to be composed of a copper-based metal as in the main body.

Studies of the present inventors have found out that because such a cooler frequently uses a relatively expensive copper-based metal, it not only increases the cost of manufacture, but also lowers the dislocation free pulling rate in high speed pulling due to excessive cooling of part of a supporting member. This seems to be because the construction of part of a supporting member using a copper-based metal the same as that of the main body over-cools part of the supporting member, which causes precipitation of a large amount of silicon oxide or the like on the surface thereof, to be dropped, leading to generaten of dislocation in a single crystal during pulling.

In addition, composing part of supporting member of a copper-based metal the same as that of the main body makes it difficult to keep the mechanical strength thereof. This may lead to risks that the distortion of part of a supporting member makes the position of the main body deviate to thereby cause the distortion of a pulled crystal resulting in the prevention of speedup, or brings about a stream explosion due to damage of piping. These risks are increased particularly when copper-based water piping is used as a supporting member.

Further, concerns also rise that the main body is difficult to design in accordance with pulling conditions resulting in a failure to sufficiently increase the pulling rate because the main body cannot be taken out of the supporting member.

An object of the present invention is to provide an apparatus for growing a crystal, the apparatus capable of avoiding a decrease in dislocation free pulling rate without lowering cooling capacity for a crystal being pulled, capable of decreasing the manufacture cost of a cooler, and capable of solving a variety of problems related to deviation in the position of a cooler.

DISCLOSURE OF THE INVENTION

In order to achieve the above-mentioned object, the present invention provides an apparatus for growing a crystal in which a coller is disposed so as to surround a single crystal to be grown from a raw material melt, and the cooler is attachably and detachably placed on the body of the above-mentioned crystal puller by an independent supporting member separated from the cooler, in an apparatus for growing a crystal that produces a single crystal from a raw material melt in a crystal puller by the CZ method.

For the placement of a coller on the body of the puller, the two can be composed of different materials by utilizing an independent supporting member separated from the cooler. More specifically, a coller can be made from a copper-based metal of good thermal conductivity; a supporting member can be composed of a material, such as stainless steel, which is cheaper than copper-based metals, is high in mechanical strength and is inferior in thermal conductivity.

Doing so can prevent excessive cooling of the supporting member without lowering cooling capacity for a crystal being pulled, avoiding a decline in dislocation free pulling rate. In addition, the cost of manufacture of a cooler is decreased and the support strength of the cooler is increased, which solves various problems related to deviation in the position thereof. Moreover, making a cooler detachable from the supporting member facilitates designing of a cooler in accordance with pulling conditions.

A cooler is composed of a metal member forcedly cooled by passage of water. The metal is preferably a copper-based metal that contains copper as the primary component and exhibits good thermal conductivity. The specific size and shape of a cooler is designed, as necessary, depending on pulling conditions.

A supporting member preferably has a plurality of supporting arms that are radially disposed around the pulling axis in the body of a puller because the arms do not prevent gas flow in the puller and are cost effective in material. Constituent materials of a supporting member are preferably those that are cheaper than copper-based metals, high in mechanical strength and low in thermal conductivity. More specifically, stainless steel is the most suitable; however, graphite, carbon fiber composites, and the like are effective as well. It is preferable in terms of speed-up of pulling rate that the supporting member is made from a material of which thermal conductivity is inferior to those of copper-based metals and then is water cooled.

A method of fixing a cooler and a supporting member thereof is not particularly limited; however, coupling with bolts is simple and preferable. More simply, although a cooler can simply be put, or hung on a supporting member thereof, it is important not to put a load on water piping to the cooler.

A cooler is desirably combined with a heat-shielding member and placed therein. Combination with a heat-shielding member not only facilitates cooling of a crystal, but also effectively suppresses a rise in the temperature of the cooler itself, leading to a promotion in speed-up of pulling rate.

BEST MODE OF CARRYING OUT THE INVENTION

Embodiments of the present invention will be set forth according to the figures hereinafter.

Figure 1:
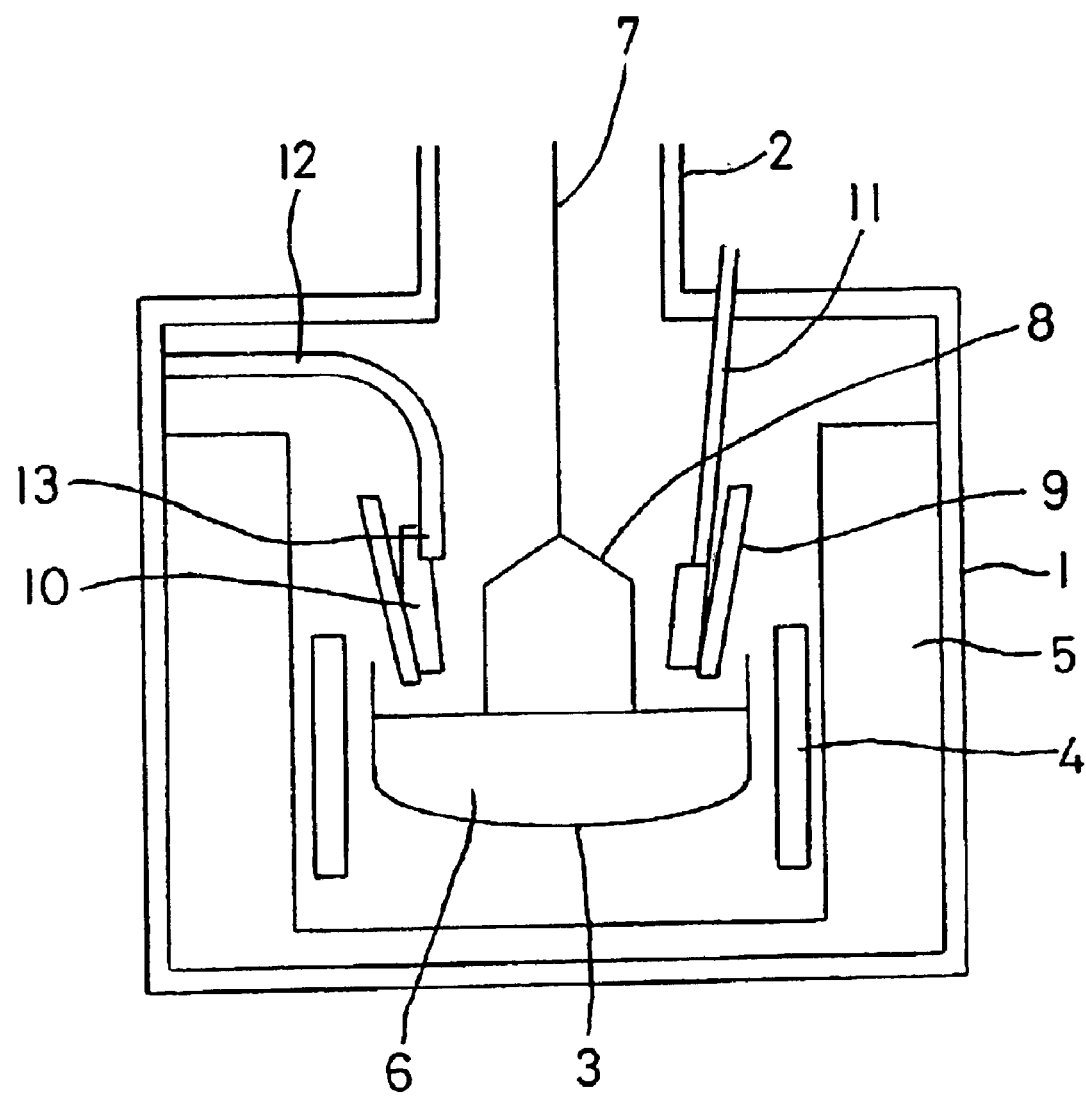
FIG. 1 shows a longitudinal section of the configuraten of a crystal puller, an example of an apparatus for growing a crystal of the present invention.

As is shown in FIG. 1, a crystal puller comprises a cylindrical main chamber 1 as the body of the puller and a pull chamber 2. The pull chamber 2, which is smaller and longer than the main chamber 1, is placed in the central upper part of the main chamber 1.

In the center of the main chamber 1 is placed a crucible 3. The crucible 3 is composed of an inner quartz crucible wherein poly-silicon is loaded, and a supporting crucible made of graphite which is fitted to the outside of the inner quartz crucible. This crucible 3 is driven rotated and elevated on a supporting axis called a pedestal.

Outside the crucible 1 is concentrically placed a resistance heater 4 and in the farther outside of the heater is placed a thermal insulating tube 5 along the inner surface of the main chamber 1. The heater 4 melts poly-silicon charged filled in the crucible 3 and forms a melt 6 of silicon in the crucible 3.

On the other hand, above the crucible 3 is hung a wire 7 as a pulling axis through the center of the pull chamber 2. The wire 7 is driven to be rotated or elevated in the axial direction by a pulling mechanism provided in the upper part of the pull chamber 2. In the lower end of the wire 7 is fixed a seed chuck holding a seed crystal. A seed crystal held by the seed chuck is immersed in the melt 6 in the crucible 3 and a silicon single crystal 8 is grown beneath the seed crystal by driving the wire 7 to gradually pull the seed crystal while rotating it.

Above the crucible 1 is also concentrically placed a cylindrical heat shield 9 surrounding the single crystal 8, close to the melt 6 of the crucible 3. The heat shield 9 is made of graphite and the diameter thereof gradually increases from the lower part upwards in order to effectively shield the radiation heat from the melt 6 and the heater 4 in the crucible 3, with the lower part of the shield inserted into the crucible 3 and the shield located above the melt 6 in the crucible 3.

Figure 2:
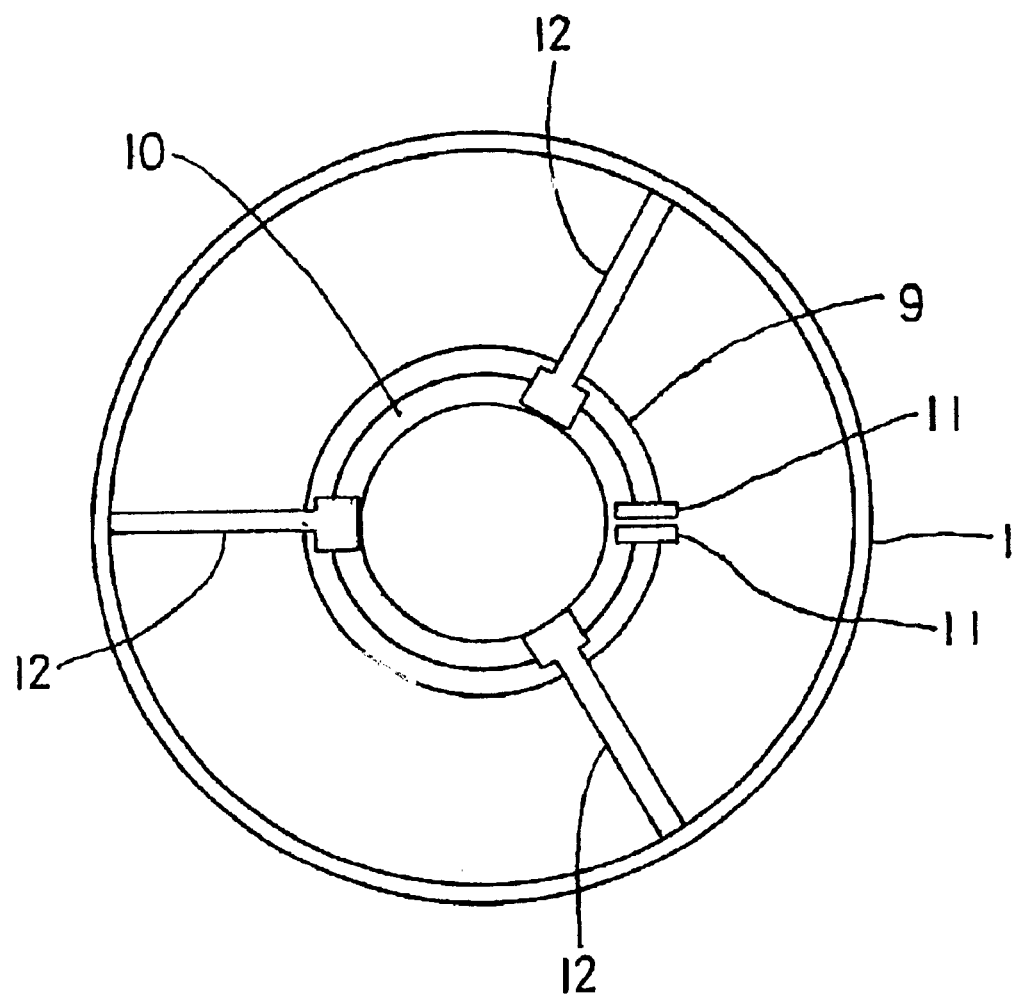
FIG. 2 shows a cross-sectional view of the crystal puller.

As shown in FIGS. 1 and 2, a coller 10 is concentrically placed inside the heat shield 9. The cooler 10 is placed inside the lower part of the heat shield 9 and is also of tapered shape, as in the heat shield 9, wherein the diameter thereof gradually increases from the lower part upwards.

Figure 3:
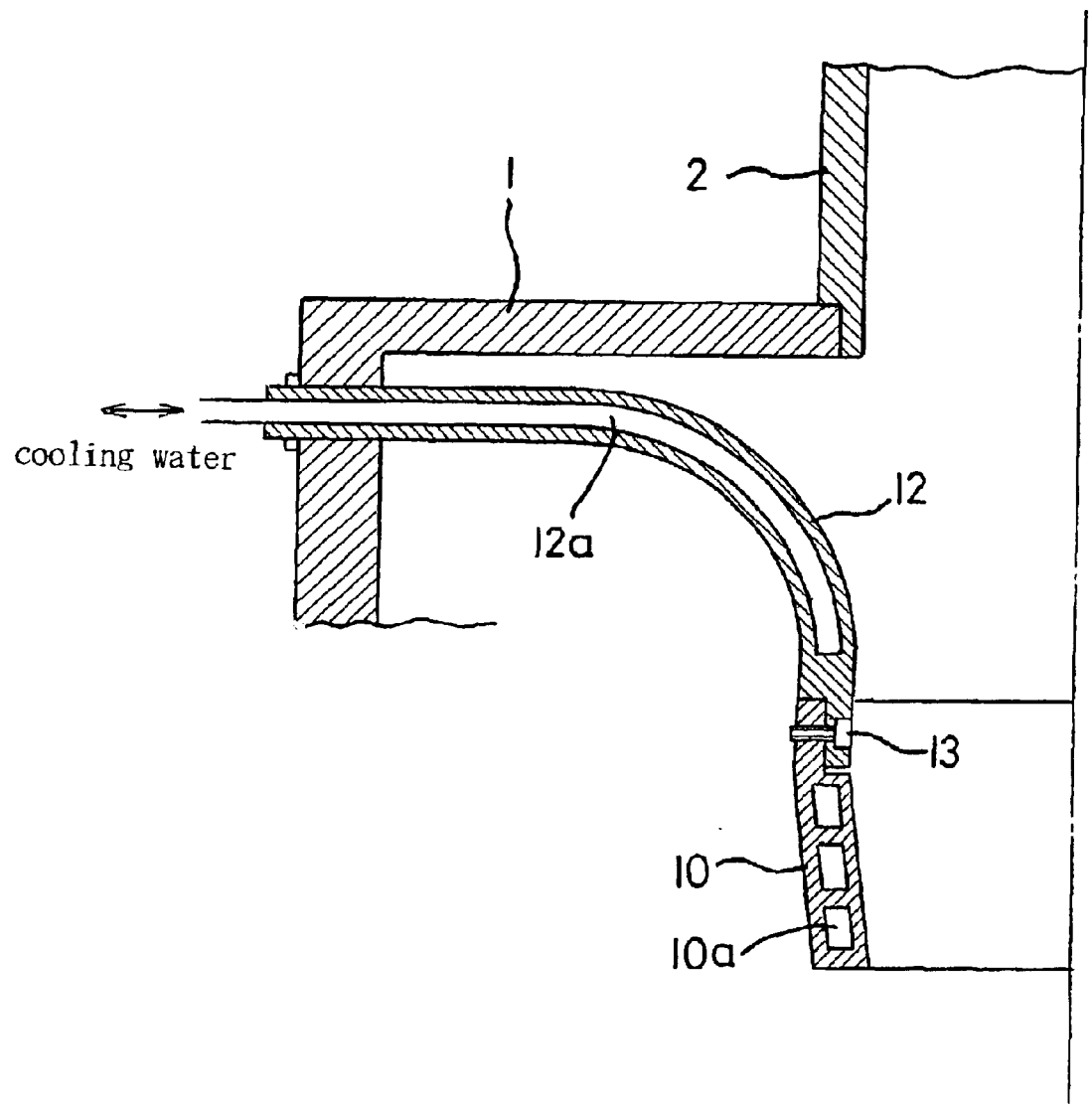
FIG. 3 shows a longitudinal section of the main part of the crystal puller.

As shown in FIG. 3, inside this cooler, composed of a copper-based metal of good thermal conductivity, is mounted a circular water passageway 10a in the form of a plurality of stages. Cooled water is supplied to the water passageway 10a through water piping 11, 11 made of a copper-based metal to thereby cool the cooler 10 forcedly, which in turn facilitates cooling of the single crystal 8, particularly the high-temperature portion thereof immediately after solidification. Water piping 11, 11 is welded to the cooler 10 and is supported so that the load of the cooler does not act thereon.

A supporting member that supports the cooler 10 inside the body of the puller is here composed of a plurality of supporting arms 12 . . . , which are radially disposed around the pulling axis in the body of the puller. The supporting arms 12 . . . are horizontally extended from the inner peripheral surface of the upper part of the main chamber 1 towards the center of the puller and are bent downward on the way to form rod members with an almost reversed shape of the letter L, the upper ends of which are fixed by penetrating the side wall of the main chamber 1. Each lower end of the supporting arms 12 . . . is connected to the upper edge of the cooler 10 detachably by a bolt 13 of the radial direction.

Each supporting arm 12 is here made of stainless steel and therein is formed a U-shaped water passageway 12a stretching in the direction of the length of the arm. Cooling water supplied to the water passageway 12a forcedly cools each supporting arm 12.

Now, operating examples will be described of crystal growth by the above-mentioned crystal puller.

A raw material of 100 kg of poly-silicon is charged in the crucible 3 and then the inside of the chamber is made to be an Ar atmosphere of 1330 Pa. The raw material of poly-silicon in the crucible 3 is melted via the heater 4 placed in the outside of the crucible 3, and using a seed crystal of 100 orientation a single crystal 8 with a diameter of 200 mm is made to grow beneath the seed crystal.

In this operaten, the crucible 3 is gradually pulled, taking into account the crystal growth, in such a way that the surface level of the melt 6 in the crucible 3 is kept constant. In addition, the crucible 3 is rotated in the direction to or in the same direction as the rotational direction of the single crystal 8.

This operaten successfully achieved a rate of 2.3 mm/min as the average pulling rate at the cylindrical part of the single crystal 8, because the cooler 10 was made of a copper-based metal. Moreover, five single crystals 8 were successfully pulled all without dislocation and the position of the cooler 10 did not deviate. This seems to be because the supporting arm 12 . . . of the cooler 10 was made of stainless steel different from that of the cooler 10, leading to the prevention of excessive cooling of the arm as well as to an increase in the support strength of the cooler 10.

For comparison, the cooler 10 and the supporting arms 12 . . . were both prepared using the same copper-based metal and both were used by water cooling. A pulling rate of 2.3 mm/min was attained; however, the dislocation free pulling rate for five crystals was only 40%, that is, two out of five crystals. The cost of manufacture of the cooler 10 including the supporting arms 12 . . . was increased to about 3 times that of the case where the cooler 10 was made of a copper-based metal and the supporting arms 12 . . . of stainless steel and then both were bolted together. In addition, the support strength of the cooler 10 was not sufficient, and so concerns rose over crystal deformation and a decrease in pulling rate, due to deviation of the position of the cooler 10, and over piping damage due to addition of a load to water piping.

Additionally, the cooler 10 and the supporting arms 12 . . . were both prepared using stainless steel and were used by water cooling. The achieved pulling rate was lowered to 1.7 mm/min. The dislocation free pulling rate for five crystals was 20%, that is one out of five crystals. This seems to be because a decrease in the speed increases the duraten of the pulling process, which increases the possibility of dislocation. The cost of manufacture of the cooler 10 including the supporting arms 12 . . . was increased to about 2.5 times that of the case where the cooler 10 was made of a copper-based metal and the supporting arms 12 . . . of stainless steel and then both were bolted together. However, the support strength of the cooler 10 was sufficient, and no concern rose over the deviation of position of the cooler 10.

INDUSTRIAL APPLICABILITY

As has been described thus far, the apparatus for growing a crystal of the present invention can avoid a decrease in dislocation free pulling rate without lowering the cooling ability for a crystal to be pulled by causing the cooler, which cools a pulled crystal to thereby increase the pulling rate, to be mounted on the body of the crystal puller and to be detachable by the independent supporting member separated from the cooler. In addition, the apparatus can save the cost of manufacture of the cooler. Moreover, the apparatus increases the support strength of the cooler to be able to avoid crystal distortion and a decrease in pulling rate, due to deviation of the position of the member, as well as piping damage due to addition of a load to water piping.

What is claimed is:

1. An apparatus for growing a crystal, the apparatus producing a single crystal from a raw material melt in a crystal puller by the CZ method, comprising:
   a cooler made of a metal body cooled by water passage is disposed so as to surround the periphery of a single crystal to be grown from the raw material melt, and said cooler is attachably and detachably placed on the body of the crystal puller by an independent supporting member separated from said cooler.

2. The apparatus for growing a crystal according to claim 1, wherein the supporting member comprises a plurality of supporting arms, the supporting arms being radially dispersed around the pulling axis in the body of the puller.

3. The apparatus for growing a crystal according to claim 1, wherein said cooler is placed inside a heat-shielding body composed of the cylindrical insulation so as to surround the periphery of said single crystal.

4. The apparatus for growing a crystal according to claim 1, wherein said metal body is made of a copper-based metal.

5. The apparatus for growing a crystal according to claim 1, wherein said supporting member is composed of a material inferior in thermal conductivity to said cooler.

6. The apparatus for growing a crystal according to claim 5, wherein said material is stainless steel.

7. The apparatus for growing a crystal according to claim 1, wherein said supporting member is forcedly water cooled.

\* \* \* \* \*

UNITED STATES PATENT AND TRADEMARK OFFICE
CERTIFICATE OF CORRECTION

PATENT NO. : 6,764,547 B2
DATED : July 20, 2004
INVENTOR(S) : Takayuki Kubo et al.

Page 1 of 1

It is certified that error appears in the above-identified patent and that said Letters Patent is hereby corrected as shown below:

Column 6,
Lines 22-23, change the word "dispersed" to -- disposed --

Signed and Sealed this

Fourteenth Day of December, 2004

JON W. DUDAS
*Director of the United States Patent and Trademark Office*